United States Patent [19]
Ritland et al.

[11] Patent Number: 5,614,043
[45] Date of Patent: Mar. 25, 1997

[54] METHOD FOR FABRICATING ELECTRONIC COMPONENTS INCORPORATING CERAMIC-METAL COMPOSITES

[75] Inventors: Marcus A. Ritland, Golden; Dennis W. Readey, Lakewood; Jack D. Sibold, Golden; James E. Stephan, Aurora, all of Colo.

[73] Assignee: Coors Ceramics Company, Golden, Colo.

[21] Appl. No.: 220,570

[22] Filed: Mar. 31, 1994

Related U.S. Application Data

[63] Continuation-in-part of Ser. No. 946,972, Sep. 17, 1992, abandoned.

[51] Int. Cl.⁶ .............................. B32B 31/26; B32B 31/12
[52] U.S. Cl. ..................... 156/89; 156/252; 264/61; 148/DIG. 69
[58] Field of Search ................ 156/89, 252; 264/60, 264/61; 148/DIG. 69; 164/91

[56] References Cited

U.S. PATENT DOCUMENTS

| | | | |
|---|---|---|---|
| 3,718,441 | 2/1973 | Landingham | 264/60 X |
| 3,864,154 | 2/1975 | Gazza et al. | 264/60 X |
| 3,928,662 | 12/1975 | Kaneko et al. | 427/294 |
| 3,949,804 | 4/1976 | Kaneko et al. | 164/62 |
| 4,232,091 | 11/1980 | Grimshaw et al. | 164/91 X |
| 4,828,008 | 5/1989 | White et al. | 164/66.1 |
| 4,868,143 | 9/1989 | Newkirk et al. | 501/127 |
| 4,935,055 | 6/1990 | Aghajanian et al. | 264/61 X |
| 4,942,076 | 7/1990 | Panicker et al. | 428/137 |
| 5,000,246 | 3/1991 | Dwivedi et al. | 164/97 |
| 5,007,475 | 4/1991 | Kennedy et al. | 164/97 |
| 5,011,725 | 4/1991 | Foster | 156/89 X |
| 5,017,533 | 5/1991 | Newkirk et al. | 501/127 |
| 5,040,588 | 8/1991 | Newkirk et al. | . |
| 5,089,881 | 2/1992 | Panicker | 357/80 |
| 5,163,499 | 11/1992 | Newkirk et al. | 164/98 |

Primary Examiner—David A. Simmons
Assistant Examiner—M. Curtis Mayes
Attorney, Agent, or Firm—Sheridan Ross P.C.

[57] ABSTRACT

The present invention relates to electronic components and in particular relates to ceramic-based electronic components wherein a portion of the component comprises a metal-infiltrated ceramic. In a preferred embodiment, the metal-infiltrated ceramic comprises copper metal.

10 Claims, 3 Drawing Sheets

METHOD FOR FABRICATING ELECTRONIC COMPONENTS INCORPORATING CERAMIC-METAL COMPOSITES

This application is a continuation-in-part of U.S. patent application Ser. No. 07/946,972, filed Sep. 17, 1992, now abandoned.

BACKGROUND OF THE INVENTION

1. Field of the Invention

The present invention relates to electronic components fabricated using ceramic substrates, such as multi-layer ceramic devices. More particularly, the present invention relates to electronic components having ceramic layers that incorporate ceramic-metal composite materials and methods of producing such components.

2. Description of Related Art

Multi-layer ceramic (MLC) devices are fabricated from a plurality of stacked ceramic sheets (substrates), wherein each sheet has a particular screened metal pattern on its planar surface and a selected pattern of feed-through vias, or holes, formed through the sheet. The vias in the ceramic sheets are usually filled in the unfired or "green" state with a slurry of refractory metal paste, i.e., tungsten particles suspended in an organic vehicle. Screen printing techniques, through either a stencil or a screen, are typically used to apply the planar metallization and to force the metallizing paste into the vias. Selected patterned and via-filled sheets are then stacked in the proper order and are laminated together with heat and pressure to form an assembly ready for sintering.

During the sintering operation, the binder is volatilized from the ceramic sheet, the patterned metallization and the via metallization. After binder removal, the temperature is increased to provide densification by sintering of the ceramic and refractory metal portion of the assembly. The metal-filled vias now become electrical conductors and provide selective electrical interconnection between the various layers of the device.

While most vias in an MLC structure are designed to provide electrical interconnection between the multiple layers, vias may also be provided to function as heat sinks for heat generating components that are placed within or on top of the device. Vias can also be included to function as electrical grounds for the components.

One of the drawbacks of screening metals into vias and conductor paths is that the metal pastes represent a significant cost to the manufacturer of the electronic component. Further, metal pastes often contain many volatile organics and other environmentally undesirable constituents that are used to adjust the theology of the paste. Moreover, the metallized ceramic device must be sintered in a non-oxidizing atmosphere to avoid oxidation of the refractory metal.

Some techniques have been developed to address one or more of these problems. U.S. Pat. No. 4,942,076 by Panicker et al., issued Jul. 17, 1990, discloses a single-layer ceramic substrate with metal-filled vias that is useful for mounting high-frequency hybrid microcircuits. Panicker et al. use a screening process to place a refractory metal (e.g., tungsten) and binder into vias that are formed in ceramic sheets and then sinter the sheets such that the tungsten-filled vias have 10 to 20 percent porosity. Copper is then screened onto the porous tungsten-filled vias and the sheets are heated to reflow the copper into the tungsten. The result is a ceramic substrate having a plurality of vias filled with about 85% tungsten and about 15% copper. It is disclosed that the vias are useful for ground connections and for carrying away internally generated heat. The substrate must be sintered in a reducing atmosphere during both the sintering step and the copper metal reflow step.

U.S. Pat. No. 5,089,881 by Panicker issued on Feb. 18, 1992. Panicker discloses a ceramic-based chip carrier for mounting an IC chip wherein certain vias in the ceramic substrate include a porous refractory metal that has copper metal reflowed into the porosity of the refractory metal. In the process for making the chip carrier, a sintered ceramic substrate is laser-drilled to form vias therein and the vias are thereafter filled with a refractory metal paste and fired in a reducing atmosphere to sinter the refractory metal into a porous mass. Copper is then screened onto the refractory metal-filled vias and is then heated in a reducing atmosphere to reflow the copper into the porous metal. At least three furnace cycles are required and the metallization must be sintered in a reducing atmosphere. This process is also not a co-fire process wherein the refractory metal and the ceramic are sintered in a single step.

U.S. Pat. No. 5,163,499 by Newkirk et al., issued on Nov. 17, 1992. Newkirk et al. disclose a method of forming electronic packages by spontaneously infiltrating a permeable mass of filler material or a preform with molten matrix metal and bonding the infiltrated material to a second material, such a ceramic or metal. Prior to infiltration the filler material or preform is in contact with a portion of the second material such that after infiltration, the infiltrated material is bonded to the second material to form a sealed electronic package.

There exists a need for a method that is useful for forming high-conductivity vias, conductor paths, ground planes and other components of ceramic-based packages that include a highly conductive material, such as copper. It would be advantageous if vias could be easily formed having a high conductivity metal and if the vias had a thermal expansion that was substantially similar to the surrounding ceramic body. It would be advantageous if the components could be sintered in a non-reducing atmosphere. It would also be advantageous if a co-fire process could be used to form the components.

SUMMARY OF THE INVENTION

According to one aspect of the present invention, a substrate for a hybrid micro-circuit is provided comprising a thin ceramic sheet and a plurality of vias in the thin ceramic sheet, wherein the vias comprise a porous ceramic matrix which has been infiltrated with a highly conductive metal. The conductive metal is preferably selected from copper and copper alloys.

According to another embodiment of the present invention, a method for making a carrier for electronic components is provided that includes the steps of forming a substantially flat and thin sheet of ceramic, forming a plurality of vias in the ceramic sheet, filling at least a portion of the vias with a ceramic-containing paste capable of forming a porous sintered ceramic, sintering the sheet of ceramic to form a sintered sheet having a plurality of vias comprising porous ceramic with an open porosity of at least about 10 volume percent and contacting the ceramic sheet with a molten metal such that the molten metal infiltrates the porous ceramic vias and fills the open porosity. In one embodiment, the ceramic via is a thermal via.

According to another embodiment of the present invention a substrate useful for mounting electronic components is provided comprising a flat ceramic sheet and a layer adhered at least to a portion of the lower surface of the ceramic sheet that consists essentially of a ceramic-metal composite. The metal infiltrated lower portion provides a heat sink for the mounted electronic components.

According to another embodiment of the present invention a method for forming a metal plane on an electronic substrate is provided by forming a substantially flat ceramic sheet, forming a porous ceramic layer on at least a portion of the ceramic sheet, contacting the porous ceramic layer with a molten metal to infiltrate the metal into the porous ceramic layer and cooling the infiltrated porous layer to form a ceramic sheet having a metal plane adhered thereto.

DESCRIPTION OF PREFERRED EMBODIMENTS

Figure 1:
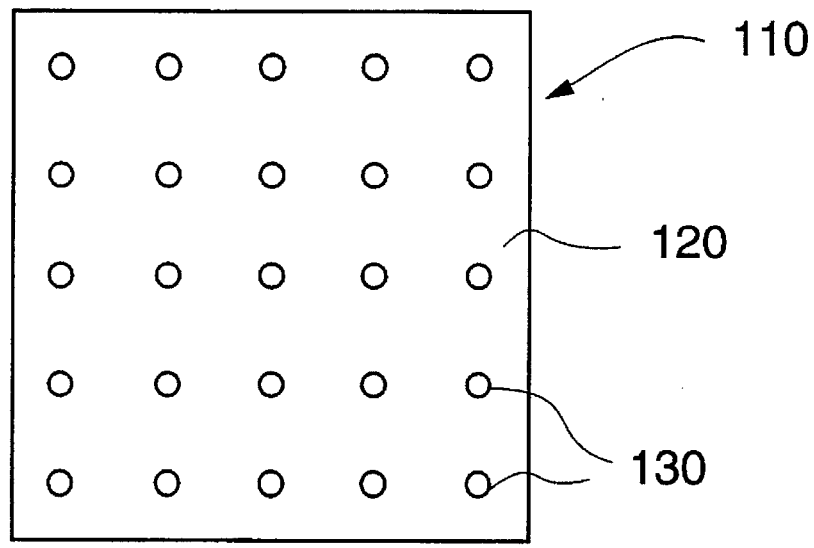
FIG. 1 illustrates a ceramic substrate having a plurality of metal-infiltrated vias according to an embodiment of the present invention.

The present invention is directed to a method for making a ceramic substrate, or sheet, that includes ceramic-metal composite portions that are useful for conducting electricity or heat. Such ceramic substrates can advantageously be formed into MLC devices that include multiple layers of ceramic sheets having ceramic-metal composite vias and ceramic-metal composite conductor paths connecting the vias. The ceramic sheets are preferably stacked, laminated and sintered before the metal is infiltrated into the MLC device to form the composite portions.

In a broad aspect, the present invention relates to fabricating ceramic sheets having selected portions of ceramic having open porosity and contacting the ceramic with a molten metal to infiltrate the metal into the open porosity. The infiltration is preferably accomplished in the absence of significant overpressures and preferably does not require a reducing atmosphere.

According to one aspect of the present invention, ceramic sheets are formed having ceramic-metal composite vias. Such vias can be useful for electrical conduction or heat conduction, particularly in a MLC device.

According to the present invention, the ceramic can be selected from virtually any ceramic useful for forming ceramic sheets used in MLC devices. For example, the ceramic material can be selected from alumina ($Al_2O_3$), aluminum nitride (AlN), beryllia (BeO), mullite ($3Al_2O_3 \cdot 2SiO_2$), or other ceramic materials. According to the present invention, a preferred ceramic material is alumina since alumina is a common ceramic for use as a substrate material. As is known to those skilled in the art, alumina can also include sintering aids, such as silica ($SiO_2$).

In addition to polycrystalline ceramics, as discussed hereinabove, glass-ceramics can also be used to form substrates. Glass-ceramic compositions can be tailored to fit a variety of needs and are typically capable of being sintered at lower temperatures than traditional oxide or non-oxide ceramics.

A ceramic sheet can be formed by any of a number of processes that are useful for forming ceramic sheets. Typically, ceramic sheets used in the production of MLC devices are formed by a tape casting process. The tape casting process includes the steps of casting a slurry onto a moving carrier surface, such as cellulose acetate, teflon, mylar or cellophane, and spreading the slurry to a controlled thickness with the edge of a blade. The cast slurry is then dried, resulting in a thin, flexible tape that can be cut or stamped to a desired configuration, such as square sheets.

Additives are typically introduced into the slurry prior to casting to control the properties of the final tape. For example, deflocculants, solvents, binders and plasticizers may be added to the ceramic material to provide desirable flexibility and handling properties of the cast tape.

Although tape casting is a preferred method of fabrication, other methods for forming the ceramic sheet may be utilized in accordance with the present invention. For example, individual ceramic sheets may be dry pressed or a plastic ceramic body can be extruded through a narrow die to form a ceramic sheet. Ceramic tape can also be manufactured by a roll compaction process wherein a powder/binder mixture is fed through rollers having the desired gap between the rollers for thickness control.

After the ceramic sheet has been fabricated, and preferably prior to sintering, the vias are formed in the ceramic sheet. Preferably, the vias are mechanically punched into the green ceramic sheet. The size of the via in the ceramic sheet is controlled by the size of the male punch and the female die opening. Most vias are round, since this is the lowest stress form and the least expensive punch to manufacture. The male punch is usually a "bed of nails" type made up of rods or punch pins extending from a planar surface, and having the desired diameter and location. The female die is a planar surface with holes matching the location of the male punch pins. The holes in the female punch are slightly larger than the male punches to provide alignment and clearance tolerances.

To fabricate a via pattern the die is opened, a sheet of ceramic tape is inserted between the die blocks and the male array of punches is forced through the tape, fracturing the tape and pushing slugs of tape into the female die.

According to the present invention, the vias which are to be infiltrated with molten metal are filled with a ceramic slurry composition that is formulated to yield a sintered ceramic having open porosity. After sintering, the ceramic tape will therefore include a plurality of vias that include a porous ceramic having substantially interconnected and open porosity. The via to be infiltrated with metal should have an open porosity of at least about 5 volume percent, preferably from about 10 volume percent to about 90 volume percent and more preferably from about 15 volume percent to about 80 volume percent.

The green ceramic sheets are therefore placed in a screen printing device having a pattern corresponding to the vias to be filled with the ceramic slurry. The ceramic slurry can be formulated to provide a high porosity ceramic body by a number of techniques. For example, the particle size of the particles in the slurry can be larger than the particle size of particles in the green ceramic sheets. The larger particle size, when sintered with the green ceramic sheets, will result in vias having open porosity. In addition, the ceramic slurry used in the vias can be formulated without the use of substantially any sintering aids. The absence of sintering aids can also result in vias having open porosity. Also, the porous ceramic in the via can be formed using pore formers. Pore formers are materials which have a volatilization temperature that is lower than the sintering temperature of the ceramic. Thus, material such as walnut shells or latex spheres can be added to the ceramic slurry. Upon sintering, the material volatilizes, leaving behind open pore space.

The ceramic slurry is squeegeed through the screen and into the selected vias. The tape is then dried so that the tape can be handled without losing any substantial amount of ceramic from the vias.

In a preferred embodiment of the present invention, planar conductor paths are also formed from the ceramic-metal composite material. In this embodiment, the green ceramic sheets are screened with the ceramic slurry, as described hereinabove for the vias. In this instance, the slurry is applied onto the surface of the ceramic sheet in a pattern that corresponds to the desired pattern for interconnecting vias and other portions of the ceramic sheet. Thus, upon sintering of the ceramic substrate, a pattern of porous ceramic paths will exist on the planar surface of the ceramic sheet.

If a MLC device is being fabricated from the sheets, the green ceramic sheets are stacked in a predetermined order and are pressed together, preferably under moderate heat, to form a green (unsintered) laminate. Alignment holes or other means can be used to align the ceramic sheets during lamination.

After a laminated body is formed, the laminated body is then sintered in a sintering furnace. For example, a laminated stack of alumina green sheets is typically sintered at from about 900° C. to about 1800° C. to densify the laminate. The sintering step can also include a binder burnout phase wherein organics are volatilized from the laminated structure. However, the sintering temperature according to the present invention can advantageously be somewhat lower than the sintering temperatures typically used for green laminates since there is no refractory metal to be co-fired with the laminate. Further, the amount of organic that needs to be burned out of the system is significantly reduced due to the lack of refractory metal paste. An additional advantage of the present invention is that the sintering does not require a reducing atmosphere, as is required when using refractory metal paste. Thus, the laminate can advantageously be sintered in air.

After sintering, the open porosity of the vias and the conductor paths is at least about 5 volume percent, preferably is from about 10 volume percent to about 90 volume percent open porosity and more preferably is from about 15 volume percent to about 80 volume percent. These levels of open porosity will permit molten metal to infiltrate into the open porosity and will result in vias and conductor paths having sufficiently high electrical conductivity for most applications.

After sintering, the ceramic substrate or laminate is brought into contact with a molten metal. Preferably the metal infiltrates the ceramic by capillary action without the assistance of substantial overpressure. As used herein, the term "substantial overpressure" refers to pressure in excess of about 3 atmospheres (about 45 psi) applied during the infiltration process, either mechanically or through the use of pressurized gas. Thus, when contacted with the sintered ceramic, the molten metal enters the pore structure of the ceramic layer and fills substantially all of the open porosity in the vias and conductor paths.

Although the present invention is applicable to many combinations of ceramic and infiltrant metals, it is preferred according to the present invention to infiltrate a high conductivity metal such as copper or silver into the ceramic matrix. In one preferred embodiment, copper is the infiltrant metal. As used herein, the term "copper metal" refers to any metal alloy that is predominantly copper, i.e., at least about 50 percent copper. Copper can be alloyed with a number of other elements and in certain preferred embodiments discussed in detail below, copper can be alloyed with oxygen or titanium.

In order to fill substantially all of the open porosity in the porous ceramic portions, it is necessary that the porous ceramic material have a three dimensional, interconnecting pore structure. Capillary action will pull the metal into the ceramic and thereby fill substantially all of the void space. It is generally preferred that the average pore size of the porous ceramic be from about 1 micrometer to about 10 micrometers; however, it is believed that if the metal wets the ceramic sufficiently, larger pore sizes can be used.

A simple substrate according to this aspect of the present invention is illustrated in FIG. 1. The substrate 110 includes a ceramic sheet 120 having a plurality of vias 130 formed in the sheet 120 on a grid. The vias 130 include a porous ceramic having metal infiltrated into the ceramic. Vias on a grid such as that illustrated in FIG. 1 are useful for electrical interconnection between various layers of a multi-layer ceramic device.

Figure 2:
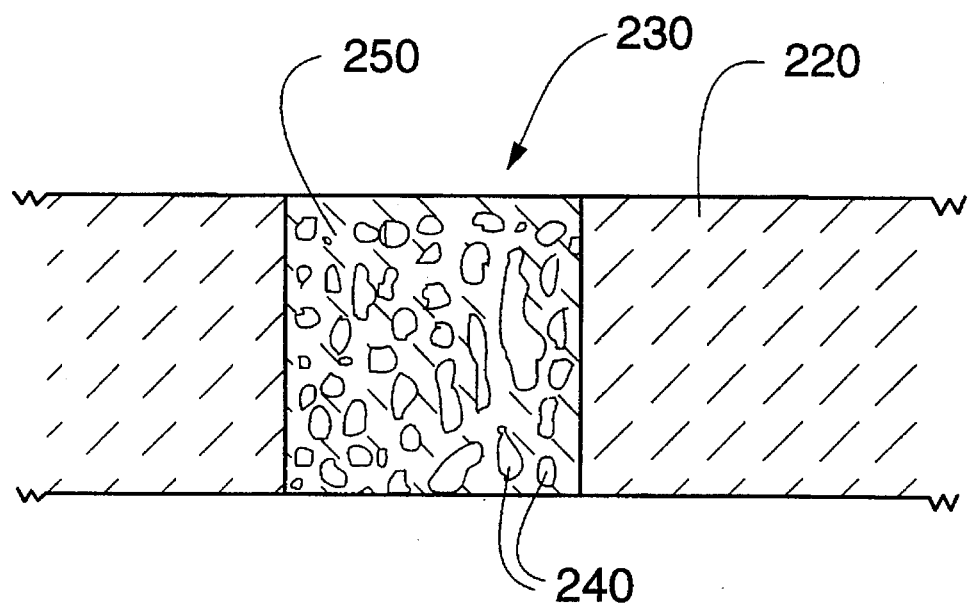
FIG. 2 illustrates the cross-section of a metal-infiltrated via according to an embodiment of the present invention.

FIG. 2 illustrates a closeup and cross section of an infiltrated via according to the present invention. The ceramic sheet 220 has a via 230 formed in the ceramic sheet. The via includes interconnected ceramic 240 that has metal 250 infiltrated into the ceramic.

When a multi-layer ceramic comprising a plurality of ceramic sheets and conductor paths connecting the vias is to be infiltrated, it is desirable that each via and conductor path is connected to a portion of the laminate that will be contacted with the molten metal. In this way, the molten metal will infiltrate up through the vias, through the conductor paths, and into other vias and substantially fill all the vias and conductor paths within the laminate. Thus, a MLC device will be formed having high conductivity vias and conductor paths without the need to sinter the laminate in a reducing atmosphere or the need to sinter the laminate in more than one sintering step. This process offers numerous advantages over the prior art.

To improve capillary action between the ceramic and the molten metal, it may be desirable to modify the wetting or spreading characteristics of the ceramic and metal. One way to do this is to coat the ceramic with a coating that is more easily wetted by the molten metal.

One way of enhancing the wetting characteristics is to modify the chemical composition of the molten metal with an infiltration additive. For instance, the wetting of molten copper on alumina can be enhanced by the addition of oxygen to the copper or with the addition of titanium (Ti). Such additions enhance the wetting and permit infiltration to occur rapidly and easily. When oxygen is added, it is preferred to add the oxygen to the copper metal in an amount of from about 1.5 weight percent to about 10 weight percent, more preferably from about 2 weight percent to about 5 weight percent. When titanium is used as an infiltration additive, it is preferably added in an amount from about 1 weight percent to about 10 weight percent.

After one or more of the surface modifications and chemical alterations noted above, if necessary, the molten metal will wet the ceramic and infiltrate substantially all of the void space of the ceramic through capillary action.

In a preferred embodiment, the metal infiltration step is performed in a vacuum atmosphere. As used herein, vacuum atmosphere refers to an atmospheric pressure of about 10 millitorr or less. The evacuation of air from the ceramic void space reduces the likelihood that air pockets will be entrapped in the composite structure.

The temperature at which infiltration takes place is dependent on the ceramic and molten metal used. For example, alumina ceramic with a 3 micrometer average pore size can be infiltrated at about 1275° C. with copper having about 3 weight percent oxygen. The total time required for infiltration is very short and typically occurs in less than about 1 hour, preferably less than about 15 minutes and more preferably less than about 1 minute.

Figure 3:
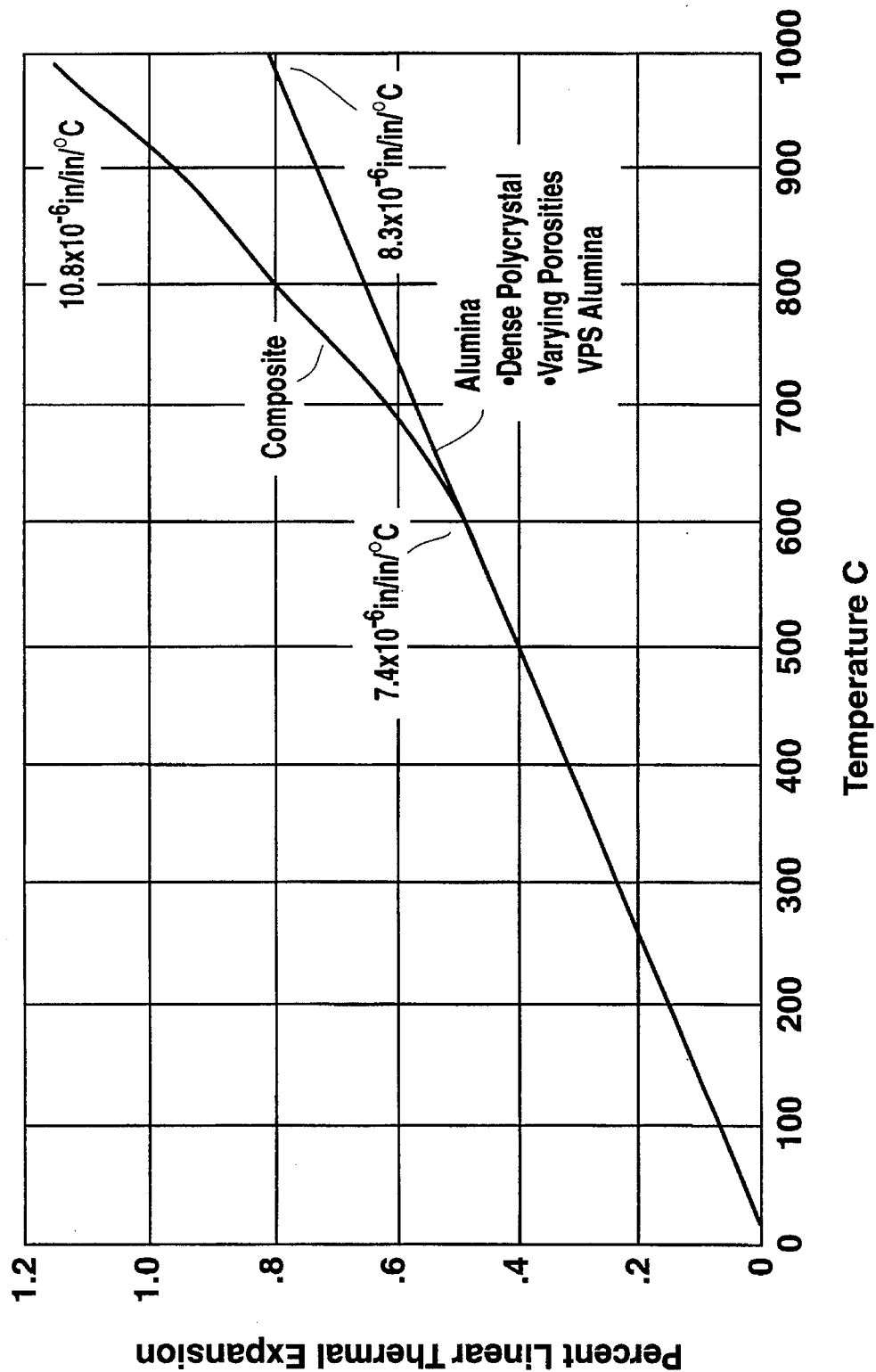
FIG. 3 illustrates a comparison of the thermal expansion of a metal infiltrated via according to the present invention with the thermal expansion of alumina used to form the ceramic sheet.

FIG. 3 illustrates one of the advantages of the ceramic-metal composite vias according to the present invention. As is illustrated in FIG. 3, the thermal expansion of such a via substantially matches the thermal expansion of alumina up to a temperature of about 600° C. Thus, such composite materials can be used without inducing significant thermal stresses onto the ceramic structure.

In another embodiment of the present invention, a ground plane is formed using an infiltration process.

According to this embodiment, a ground plane having high conductivity is formed by infiltrating a high conductivity metal into a porous ceramic portion of a ceramic substrate.

According to this embodiment of the invention, a ceramic sheet is formed, substantially as described hereinabove. The ceramic sheet may or may not include vias depending on the end-use and location of the sheet in a MLC device.

To form a ground plane, a ceramic slurry that is formulated to yield a sintered ceramic having open porosity is screened onto at least a portion of the ceramic sheet. Therefore, the ceramic sheet comprises two layers wherein one layer comprises a ceramic green body formulated to produce a high density and an adjacent layer includes a ceramic slurry formulated to yield a high open porosity. In a preferred embodiment, the ceramic slurry includes alumina. Preferably, the open porosity is at least about 5 volume percent and is preferably from about 10 volume percent to about 90 volume percent and is more preferably from about 15 volume percent to about 80 volume percent.

This configuration is then placed in a sintering furnace and sintered to densify the layer formulated to achieve high density and to create an adjacent sintered ceramic layer having open porosity and preferably including alumina ceramic.

Thereafter, the adjacent layer is contacted with molten metal in order to infiltrate metal into the porous layer, as described hereinabove.

Figure 4:
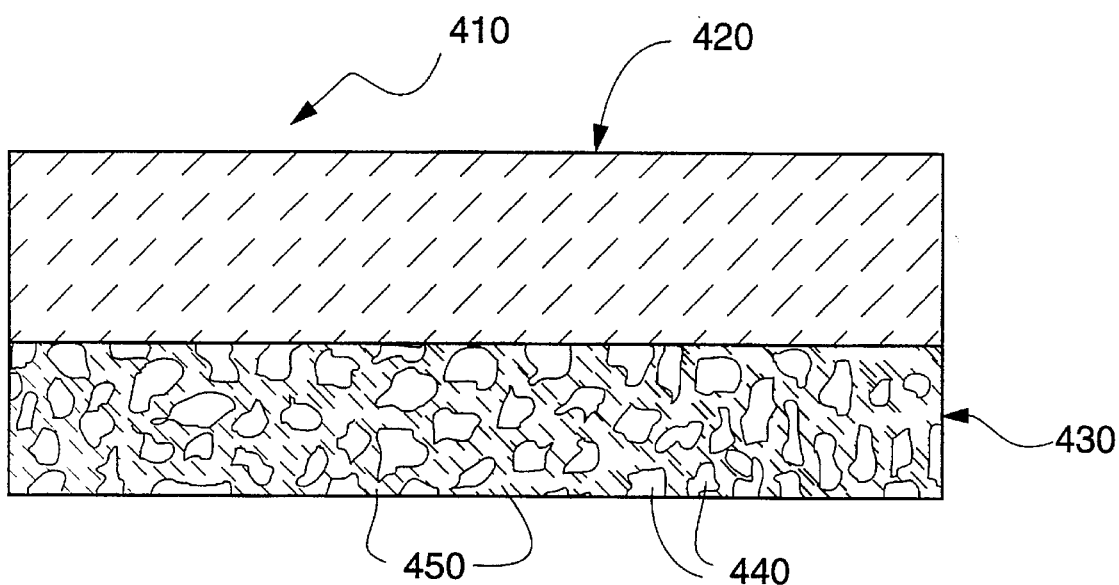
FIG. 4 illustrates a cross-section of a metal infiltrated ground plane according to an embodiment of the present invention.

A substrate produced according to this aspect of the invention is illustrated in FIG. 4. FIG. 4 illustrates a substrate 410 having a first ceramic layer 420 and a ceramic-metal composite layer 430 adjacent to the ceramic layer 420. The ceramic-metal composite layer 430 includes a substantially continuous ceramic phase 340 having a substantially continuous metal phase 450 infiltrated into the ceramic. Substrates such as that illustrated in FIG. 4 are useful for ground planes in multi-layer ceramic devices.

While the foregoing is illustrative of the benefits of using infiltrated ceramic-metal composites in electronic devices, those skilled in the art will realize other applications of the process. For example, bonding pads can be formed using composites according to the present invention.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for making a substrate for electronic components, comprising the steps of:

(a) forming a substantially flat and thin green sheet of ceramic having an upper surface and a lower surface;

(b) forming a plurality of vias in said upper surface of said green ceramic sheet and extending through said green ceramic sheet;

(c) filling at least a portion of said vias with a ceramic slurry capable of forming a porous sintered ceramic having a porosity of at least about 5 volume percent after sintering;

(d) sintering said sheet of ceramic to form a sintered sheet having a plurality of vias comprising porous ceramic having an open porosity of at least about 5 volume percent;

(e) contacting said ceramic sheet with a molten metal under conditions such that said molten metal infiltrates said porous ceramic vias and substantially fills said porous ceramic vias; and (f) cooling said metal infiltrated ceramic to form a ceramic sheet having ceramic-metal composite vias.

2. A method as recited in claim 1, wherein said sintering step comprises the step of sintering in air.

3. A method as recited in claim 1, wherein said metal comprises copper metal.

4. A method as recited in claim 1, wherein said ceramic sheet comprises alumina.

5. A method as recited in claim 1, wherein at least one of said vias is a thermal via.

6. A method as recited in claim 1, further comprising the step of stacking and laminating a plurality of said green ceramic sheets to form a multi-layer ceramic.

7. A method as recited in claim 1, further comprising the step of applying a ceramic slurry to said upper surface of said green sheet of ceramic, wherein said slurry is capable of forming a porous sintered ceramic having a porosity of at least about 5 volume percent after sintering.

8. A method for making a multi-layer ceramic device for electronic components, comprising the steps of:

(a) forming a plurality of substantially flat and thin green sheets of ceramic, each of said green sheets having an upper surface and a lower surface;

(b) forming a plurality of vias in at least one of said green sheets of ceramic;

(c) filling at least a portion of said vias with a ceramic slurry capable of forming a porous sintered ceramic having a porosity of at least about 5 volume percent after sintering;

(d) applying a ceramic slurry capable of forming a porous sintered ceramic having a porosity of at least about 5 volume percent after sintering to at least a portion of said upper surface of at least one of said green sheets of ceramic to form a porous conductor path;

(e) stacking and laminating said sheets of ceramic to form a multi-layer ceramic device;

(f) sintering said multi-layer ceramic device to form a sintered multi-layer ceramic device;

(g) contacting said sintered multi-layer device with a molten metal under conditions such that said molten metal infiltrates said porous vias and said porous conductive path portions to form a plurality of conductive vias and conductive paths within said multi-layer ceramic device; and (h) cooling said metal infiltrated multi-layered ceramic device.

9. A method as recited in claim 8, wherein said metal comprises copper metal.

10. A method as recited in claim 8, wherein said ceramic slurry comprises alumina ceramic.

* * * * *